(12) United States Patent
Kim

(10) Patent No.: US 11,171,642 B2
(45) Date of Patent: Nov. 9, 2021

(54) DRIVER CIRCUIT FOR CONTROLLING P-CHANNEL MOSFET, AND CONTROL DEVICE COMPRISING SAME

(71) Applicant: LG CHEM, LTD., Seoul (KR)

(72) Inventor: Jun-Yeob Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 17/054,928

(22) PCT Filed: Oct. 28, 2019

(86) PCT No.: PCT/KR2019/014308
§ 371 (c)(1),
(2) Date: Nov. 12, 2020

(87) PCT Pub. No.: WO2020/091356
PCT Pub. Date: May 7, 2020

(65) Prior Publication Data
US 2021/0258006 A1    Aug. 19, 2021

(30) Foreign Application Priority Data
Oct. 30, 2018   (KR) .......................... 10-2018-0131303

(51) Int. Cl.
*G05F 1/10* (2006.01)
*G05F 1/40* (2006.01)
(Continued)

(52) U.S. Cl.
CPC ......... *H03K 17/162* (2013.01); *H03K 17/302* (2013.01)

(58) Field of Classification Search
None
See application file for complete search history.

(56) References Cited

U.S. PATENT DOCUMENTS 4,536,699 A * 8/1985 Baker ...................... G05F 1/56
                                                       323/276
5,815,362 A     9/1998 Kahr et al.
(Continued)

FOREIGN PATENT DOCUMENTS

CN        106569535 A    4/2017
CN        107959491 A    4/2018
(Continued)

OTHER PUBLICATIONS

International Search Report (PCT/ISA/210) issued in PCT/KR2019/014308, dated Feb. 21, 2020.
(Continued)

*Primary Examiner* — Kenneth B Wells
(74) *Attorney, Agent, or Firm* — Birch, Stewart, Kolasch & Birch, LLP

(57) ABSTRACT

A driver circuit for controlling a P-channel MOSFET includes a first voltage divider connected to a source terminal of the P-channel MOSFET, a first sub-transistor including a first collector terminal, a first emitter terminal and a first base terminal, the first collector terminal is connected to the first voltage divider, a second sub-transistor including a second collector terminal, a second emitter terminal and a second base terminal, the second emitter terminal is connected to a gate terminal of the P-channel MOSFET, and the second base terminal is connected to a first connection node, a third sub-transistor including a third collector terminal, a third emitter terminal and a third base terminal, the third emitter terminal is connected to the second emitter terminal, and the third collector terminal is connected to a ground, and a first resistor connected between the second collector terminal and the second emitter terminal.

20 Claims, 5 Drawing Sheets

(51) Int. Cl.
*G05F 1/56* (2006.01)
*G05F 1/565* (2006.01)
*G05F 1/575* (2006.01)
*H03K 17/16* (2006.01)
*H03K 17/30* (2006.01)

(56) References Cited

U.S. PATENT DOCUMENTS

| | | | |
|---|---|---|---|
| 5,946,270 A * | 8/1999 | Jang | H02H 3/04 367/18 |
| 6,236,194 B1 * | 5/2001 | Manabe | G05F 1/565 323/274 |
| 6,781,805 B1 | 8/2004 | Urakawa | |
| 7,362,078 B2 * | 4/2008 | Agari | G05F 1/575 323/268 |
| 7,793,116 B2 * | 9/2010 | Chuang | H01M 10/48 713/300 |
| 7,800,433 B2 * | 9/2010 | Yoshikawa | H03K 19/017545 327/547 |
| 8,026,705 B2 | 9/2011 | Chen et al. | |
| 8,284,532 B2 * | 10/2012 | Yu | H02H 9/04 361/91.1 |
| 8,345,398 B2 * | 1/2013 | Mazzarisi | H02H 9/041 361/93.9 |
| 9,753,478 B2 | 9/2017 | Wiemeyer | |
| 9,893,510 B2 * | 2/2018 | Kramer | H05B 41/2928 |
| 10,778,019 B2 * | 9/2020 | Gagnon | H02H 3/18 |
| 2007/0139841 A1 | 6/2007 | Ohshima | |
| 2013/0278300 A1 | 10/2013 | Domingo et al. | |
| 2015/0008972 A1 | 1/2015 | Solomko et al. | |
| 2017/0102724 A1 | 4/2017 | Petenyi | |
| 2018/0083618 A1 | 3/2018 | Sato et al. | |

FOREIGN PATENT DOCUMENTS

| | | |
|---|---|---|
| JP | 5-25945 U | 4/1993 |
| JP | 8-140273 A | 5/1996 |
| JP | 2006-319711 A | 11/2006 |
| JP | 2018-50289 A | 11/2006 |
| JP | 5305325 B2 | 10/2013 |
| KR | 10-2005-0045345 A | 5/2005 |
| KR | 10-1076764 B1 | 10/2011 |
| KR | 10-2015-0006389 A | 1/2015 |
| WO | WO 2016/019742 A1 | 2/2016 |

OTHER PUBLICATIONS

Partial Supplementary European Search Report dated Jul. 27, 2021 in corresponding European Patent Application No. 19878796.2.
European Search Report dated Sep. 23, 2021 for corresponding European Application No. 19878796.2.

* cited by examiner

Conventional Art

DRIVER CIRCUIT FOR CONTROLLING P-CHANNEL MOSFET, AND CONTROL DEVICE COMPRISING SAME

The present application claims priority to Korean Patent Application No. 10-2018-0131303 filed in the Republic of Korea on Oct. 30, 2018, the disclosure of which is incorporated herein by reference.

TECHNICAL FIELD

The present disclosure relates to a driver circuit for controlling a P-channel Metal Oxide Semiconductor Field Effect transistor (MOSFET) as a main switch installed on a power line between a power supply and an electrical load, and a control device including the same.

BACKGROUND ART

An electrical load, such as an electric motor mounted in an electric vehicle, is connected to a power supply through a main switch. A control device selectively controls the main switch into an ON-state or an OFF-state. While the main switch is in the ON-state (i.e., is ON), power from the power supply is supplied to the electrical load through the main switch.

FIG. 1 is an exemplary diagram showing a configuration of the control device according to the related art. Referring to FIG. 1, a drain terminal and a source terminal, provided in an N-channel Metal Oxide Semiconductor Field Effect transistor (MOSFET) as the main switch, are electrically connected to the power supply and the electrical load respectively. When a controller outputs a control signal (e.g., a high level of voltage) to a gate terminal of the main switch, a current channel conducts between the drain terminal and the source terminal of the main switch, then power may be supplied from the power supply to the electrical load. When there is no need to drive the electrical load, the controller stops outputting the control signal to transition the main switch to the OFF-state.

However, even when the control signal is not applied to the gate terminal of the N-channel MOSFET, a minus voltage may be temporarily generated at the source terminal of the N-channel MOSFET due to the inductance component of the electrical load. Accordingly, a forward bias above the threshold voltage may be applied between the gate terminal and the source terminal of the N-channel MOSFET, and unintentionally, the N-channel MOSFET may repeatedly turn ON and OFF in an alternating manner. This phenomenon may continue until most of electrical energy stored in the electrical load is used up, and it is not desirable from a safety perspective.

DISCLOSURE

Technical Problem

The present disclosure is designed to solve the above-described problem, and therefore the present disclosure is directed to providing a driver circuit using a P-channel Metal Oxide Semiconductor Field Effect transistor (MOSFET), rather than an N-channel MOSFET, as a main switch that is connected between a power supply and an electrical load, in order to prevent the malfunction of the main switch caused by the inductance component of the electrical load, and the present disclosure is directed to a control device including the driver circuit.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

To achieve the above-described object, various embodiments of the present disclosure are as follows.

A driver circuit according to an aspect of the present disclosure is for controlling a P-channel Metal Oxide Semiconductor Field Effect transistor (MOSFET) and includes a gate terminal, a source terminal connected to a power supply and a drain terminal connected to an electrical load. The driver circuit includes a first voltage divider including a first resistor and a second resistor connected in series through a first connection node. One end of the first voltage divider being connected to the source terminal of the P-channel MOSFET. The driver circuit further includes a first sub-transistor including a first collector terminal, a first emitter terminal and a first base terminal, the first collector terminal being connected to an other end of the first voltage divider, and the first emitter terminal being connected to a ground, a second sub-transistor including a second collector terminal, a second emitter terminal and a second base terminal, the second emitter terminal being connected to the gate terminal of the P-channel MOSFET, and the second base terminal being connected to the first connection node, a third sub-transistor including a third collector terminal, a third emitter terminal and a third base terminal, the third emitter terminal being connected to the second emitter terminal, and the third collector terminal being connected to the ground, and a first resistor connected between the second collector terminal and the second emitter terminal.

The first connection node may be further connected to the third base terminal.

A resistance of the first dividing resistor may be higher than a resistance of the second dividing resistor.

The third emitter terminal may be further connected to the gate terminal of the P-channel MOSFET.

The first voltage divider may be configured to generate a first switching voltage at the first connection node using an input voltage from the power supply while the first sub-transistor is turned on. The third sub-transistor may be turned on in response to the first switching voltage being applied to the third base terminal.

A second switching voltage across the first resistor may be applied between the source terminal and the gate terminal of the P-channel MOSFET while the third sub-transistor is turned on.

An input voltage from the power supply may be applied to each of the second base terminal and the third base terminal through the first connection node while the first sub-transistor is turned off. The second sub-transistor may be turned on in response to the input voltage being applied to the second base terminal. The third sub-transistor may be turned off in response to the input voltage being applied to the third base terminal. The input voltage may be applied to the gate terminal of the P-channel MOSFET through the second emitter terminal while the second sub-transistor is turned on and the third sub-transistor is turned off.

Each of the first sub-transistor and the second sub-transistor may be an NPN type transistor, and the third sub-transistor may be a PNP type transistor.

The driver circuit may further include a second voltage divider connected between the second emitter terminal and the ground, the second voltage divider including a third dividing resistor and a fourth dividing resistor connected in series through a third connection node, a fourth sub-transistor including a fourth collector terminal, a fourth emitter terminal and a fourth base terminal, the fourth emitter terminal being connected to the ground, and the fourth base terminal being connected to the third connection node, and a discharge resistor. One end of the discharge resistor is connected to the drain terminal of the P-channel MOSFET and an other end of the discharge resistor is connected to the fourth collector terminal.

The second voltage divider may be configured to generate a third switching voltage at the third connection node while the first sub-transistor is turned off. The fourth sub-transistor may be turned on in response to the third switching voltage being applied to the fourth base terminal.

A control device according to another aspect of the present disclosure includes the driver circuit.

The control device includes the P-channel MOSFET, the power supply, the electrical load, and a controller configured to output a control signal to the driver circuit.

The P-channel MOSFET is a main switch connected between the power supply and the electrical load to prevent a malfunction of the main switch caused by an inductance component of the electrical load.

A driver circuit according to an aspect of the present disclosure us for controlling a P-channel Metal Oxide Semiconductor Field Effect transistor (MOSFET) including a gate terminal, a source terminal connected to a power supply, and a drain terminal connected to an electrical load, the driver circuit includes a first voltage divider including at least a first dividing resistor, one end of the first voltage divider being connected to the source terminal of the P-channel MOSFET, a first sub-transistor including a first collector terminal, a first emitter terminal and a first base terminal, the first collector terminal being connected to an other end of the first voltage divider, the first base terminal configured to be connected to a controller, and the first emitter terminal being connected to a ground, the first sub-transistor is configured to be turned on by a control signal from a controller, a second sub-transistor including a second collector terminal, a second emitter terminal and a second base terminal, the second emitter terminal being connected to the gate terminal of the P-channel MOSFET, and the second base terminal being connected to the first connection node, a third sub-transistor including a third collector terminal, a third emitter terminal and a third base terminal, the third emitter terminal being connected to the second emitter terminal, and the third collector terminal being connected to the ground, and a first resistor connected between the second collector terminal and the second emitter terminal.

Each of the first sub-transistor and the second sub-transistor is an NPN type transistor, and the third sub-transistor is a PNP type transistor.

The driver circuit is configured to transition the P-channel MOSFET from an OFF-state to an ON-state in response to the controller outputting the control signal.

In response to the controller outputting the control signal, a forward bias is applied to the first sub-transistor to transition the first sub-transistor to an ON-state, a reverse bias is applied to the second sub-transistor to transition the second sub-transistor to an OFF state, a forward bias is applied to the third transistor to transition the third transistor to an ON state, and the P-channel MOSFET is transitioned to an ON-state.

In response to the controller stopping outputting the control signal, a reverse bias is applied to the first sub-transistor to transition the first sub-transistor to an OFF-state, a forward bias is applied to the second sub-transistor to transition the second sub-transistor to an ON state, a reverse bias is applied to the third transistor to transition the third transistor to an OFF state, and the P-channel MOSFET is transitioned to an OFF-state.

The third emitter terminal is further connected to the gate terminal of the P-channel MOSFET.

The first voltage divider is configured to generate a first switching voltage at the first connection node using an input voltage from the power supply while the first sub-transistor is turned on, and the third sub-transistor is turned on in response to the first switching voltage being applied to the third base terminal.

A second switching voltage across the first resistor is applied between the source terminal and the gate terminal of the P-channel MOSFET while the third sub-transistor is turned on.

Advantageous Effects

According to at least one of the embodiments of the present disclosure, a P-channel Metal Oxide Semiconductor Field Effect transistor (MOSFET) is used as a main switch connected between a power supply and an electrical load rather than an N-channel MOSFET, thereby preventing the malfunction of the main switch caused by the inductance component of the electrical load.

Additionally, according to at least one of the embodiments of the present disclosure, it is possible to reduce the likelihood of malfunction of the main switch more effectively by forcibly discharging electrical energy stored in the electrical load due to the inductance component of the electrical load while the main switch is controlled into an OFF-state.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawing.

BEST MODE

Figure 1:
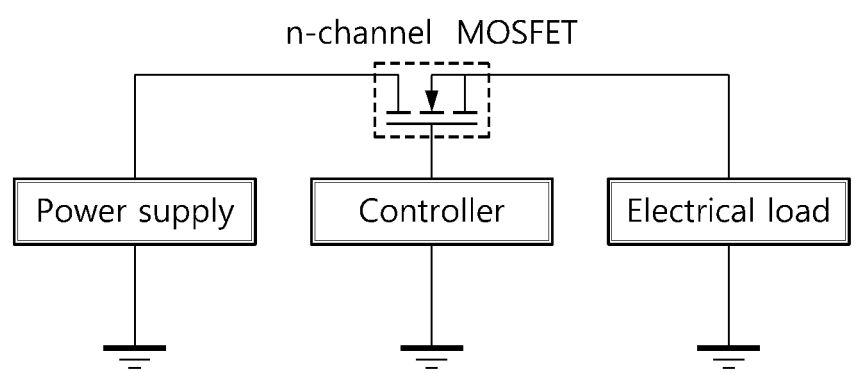
FIG. 1 is an exemplary diagram showing a configuration of a control device according to the related art.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements.

In addition, throughout the specification, it will be further understood that when an element is referred to as being "connected to" another element, it can be directly connected to the other element or intervening elements may be present.

Figure 2:
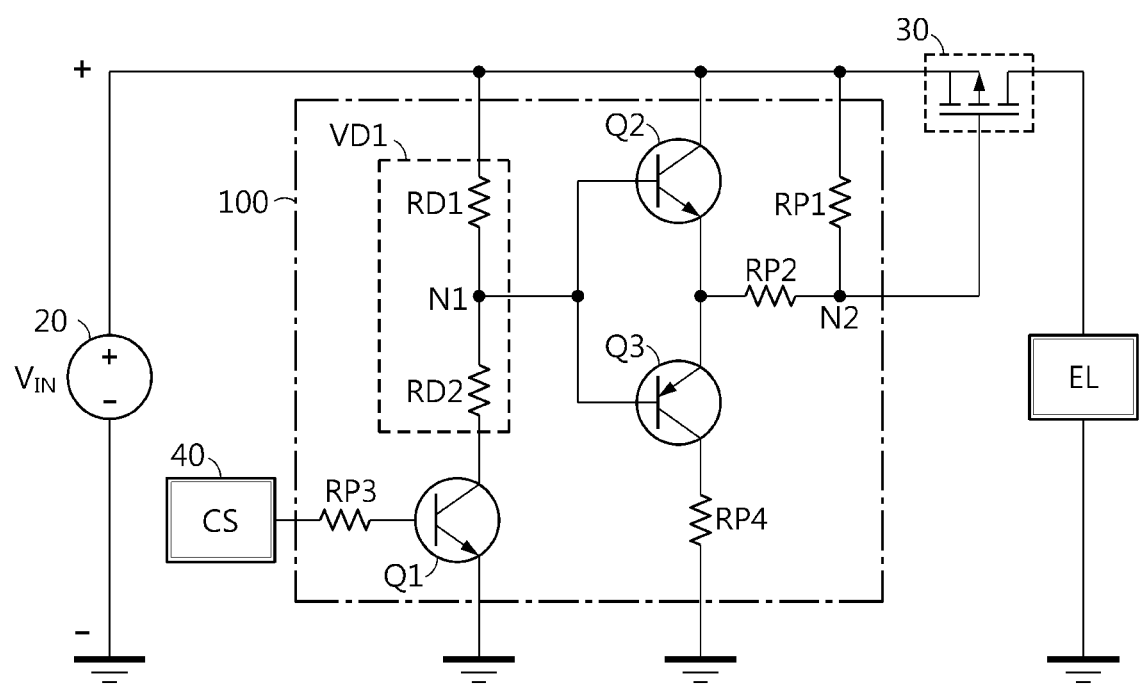
FIG. 2 is an exemplary diagram showing a configuration of a control device according to a first embodiment of the present disclosure.

FIG. 2 is an exemplary diagram showing a configuration of a control device 10 according to a first embodiment of the present disclosure.

Referring to FIG. 2, the control device 10 is for selectively supplying an input voltage $V_{IN}$ to an electrical load EL, and the control device 10 includes a power supply 20, a main switch 30, a controller 40 and a driver circuit 100. The electrical load EL may be, for example, a contactor coil, a light emitting diode a heater or the like, installed in an electric vehicle.

The power supply 20 is configured to generate the input voltage $V_{IN}$ (e.g., 12V). The power supply 20 may include, for example, a lead-acid battery (e.g., or any other known type of battery) and a DC-DC converter, but is not limited thereto. The DC-DC converter may generate the input voltage $V_{IN}$ by decreasing or increasing the direct current voltage from the lead-acid battery.

The main switch 30 is electrically connected between the power supply 20 and the electrical load EL. The main switch 30 may be a P-channel Metal Oxide Semiconductor Field Effect transistor (MOSFET) having a source terminal, a drain terminal and a gate terminal. The source terminal of the main switch 30 is electrically connected to the power supply 20. The drain terminal of the main switch 30 is electrically connected to the electrical load EL. One end (e.g., a first end) of the electrical load EL may be electrically connected to the drain terminal of the main switch 30, and an other end (e.g., a second end) of the electrical load EL may be grounded. The gate terminal of the main switch 30 may be electrically connected to the driver circuit 100.

When a source-gate voltage of the main switch 30 is equal to or higher than a threshold voltage, the main switch 30 is turned on, and otherwise (when the source gate voltage of the main switch 30 is less than the threshold voltage), the main switch 30 is turned off. The source-gate voltage is a voltage as a result of subtracting the voltage of the gate terminal of the main switch 30 from the voltage of the source terminal of the main switch 30.

The controller 40 may be configured to selectively output a control signal CS to the driver circuit 100. The controller 40 may be configured to output the control signal CS in response to a first command from an external device (e.g., a Micro Controller Unit (MCU) of the electric vehicle). The controller 40 may be configured to stop outputting the control signal CS in response to a second command from the external device. When the electric vehicle is keyed on, the external device may output the first command, and when the electric vehicle is keyed off, output the second command.

The control signal CS may be for inducing the driver circuit 100 to supply the input voltage VTN to the electrical load EL (i.e., turn on the main switch 30). That is, when the controller 40 outputs the control signal CS to the driver circuit 100, the driver circuit 100 transitions the main switch 30 to an ON-state. On the contrary, when the controller 40 stops outputting the control signal CS, the driver circuit 100 transitions the main switch 30 to an OFF-state.

The controller 40 is provided as a driver IC for the main switch 30, and in hardware, may include at least one of application specific integrated circuits (ASICs), digital signal processors (DSPs), digital signal processing devices (DSPDs), programmable logic devices (PLDs), field programmable gate arrays (FPGAs), microprocessors and electrical units, but not limited thereto, for performing other functions. The controller 40 may have a memory device embedded therein, and the memory device may include, for example, RAM, ROM, register, hard disk, optical recording media, magnetic recording media or any other known type of media. The memory device may store, update and/or erase programs including various types of control logics that are executed by the controller 40, and/or data created when the control logics are executed.

The driver circuit 100 includes a first voltage divider VD1, a first sub-transistor Q1, a second sub-transistor Q2 and a third sub-transistor Q3. The driver circuit 100 may further include at least one of a first resistor RP1, a second resistor RP2, a third resistor RP3 and a fourth resistor RP4.

The first voltage divider VD1 includes a first dividing resistor RD1 and a second dividing resistor RD2. The first dividing resistor RD1 and the second dividing resistor RD2 are connected in series through a first connection node N1. The resistance (e.g., 10 kΩ) of the first dividing resistor RD1 may be preset to be higher than the resistance (e.g., 1 kΩ) of the second dividing resistor RD2. The resistance of the second dividing resistor RD2 may be equal to the resistance of the fourth resistor RP4. One end of the first voltage divider VD1 (i.e., one end of the first dividing resistor RD1) is connected to the source terminal of the main switch 30.

The first sub-transistor Q1 is electrically connected between an other end of the first voltage divider VD1 (i.e., the other end of the second dividing resistor RD2) and the ground. That is, the first dividing resistor RD1, the first connection node N1, the second dividing resistor RD2 and the first sub-transistor Q1 are sequentially connected in series between the source terminal of the main switch 30 and the ground.

The first sub-transistor Q1 may be an NPN type transistor having a collector terminal, an emitter terminal and a base terminal. The collector terminal of the first sub-transistor Q1 is electrically connected to the other end of the first voltage divider VD1. The emitter terminal of the first sub-transistor Q1 is grounded. The base terminal of the first sub-transistor Q1 is electrically connected to the controller 40 through the third resistor RP3 having a predetermined resistance (e.g., 7510, to receive an input of the control signal CS from the controller 40.

The control signal CS from the controller 40 is applied to the base terminal of the first sub-transistor Q1 through the third resistor RP3. The control signal CS is the forward voltage, and may be applied between the base terminal and the emitter terminal of the first sub-transistor Q1.

One terminal of the second sub-transistor Q2 is electrically connected to the source terminal of the main switch 30. An other terminal of the second sub-transistor Q2 is electrically connected to one terminal of the third sub-transistor Q3. The second sub-transistor Q2 may be a negative-positive-negative NPN type transistor having a collector terminal, an emitter terminal and a base terminal. The collector terminal of the second sub-transistor Q2 is electrically connected to the source terminal of the main switch 30. The emitter terminal of the second sub-transistor Q2 is electrically connected to one terminal (e.g., the emitter terminal) of the third sub-transistor Q3. The base terminal of the second sub-transistor Q2 is electrically connected to the first connection node N1.

One terminal (e.g., the emitter terminal) of the third sub-transistor Q3 is electrically connected to the other terminal (e.g., emitter terminal) of the second sub-transistor Q2. The other terminal (e.g., a collector terminal) of the third sub-transistor Q3 may be connected to the ground through the fourth resistor RP4. The third sub-transistor Q3 may be a positive-negative-positive (PNP) type transistor having a collector terminal, an emitter terminal and a base terminal. The emitter terminal of the third sub-transistor Q3 is electrically connected to the emitter terminal of the second sub-transistor Q2. The collector terminal of the third sub-transistor Q3 is grounded through the fourth resistor RP4 having a predetermined resistance (e.g., 1 kΩ). The base terminal of the third sub-transistor Q3 is electrically connected to the first connection node N1 in common with the base terminal of the second sub-transistor Q2.

The first resistor RP1 and the second resistor RP2 are connected in series through a second connection node N2. The series circuit of the first resistor RP1 and the second resistor RP2 is connected in parallel to the second sub-transistor Q2. The resistance (e.g., 10 kΩ) of the first resistor RP1 may be higher than the resistance (e.g., 30Ω) of the second resistor RP2. The resistance of the first resistor RP1 and the resistance of the first dividing resistor RD1 may be equal. The second resistor RP2 prevents a rapid voltage change at the gate terminal of the main switch 30.

When the second resistor RP2 is eliminated from the driver circuit 100, the first resistor RP1 is connected in parallel to the second sub-transistor Q2. In this case, the gate terminal of the main switch 30 is connected in common to the emitter terminal of each of the second sub-transistor Q2 and the third sub-transistor Q3 instead of the second connection node N2.

Figure 3:
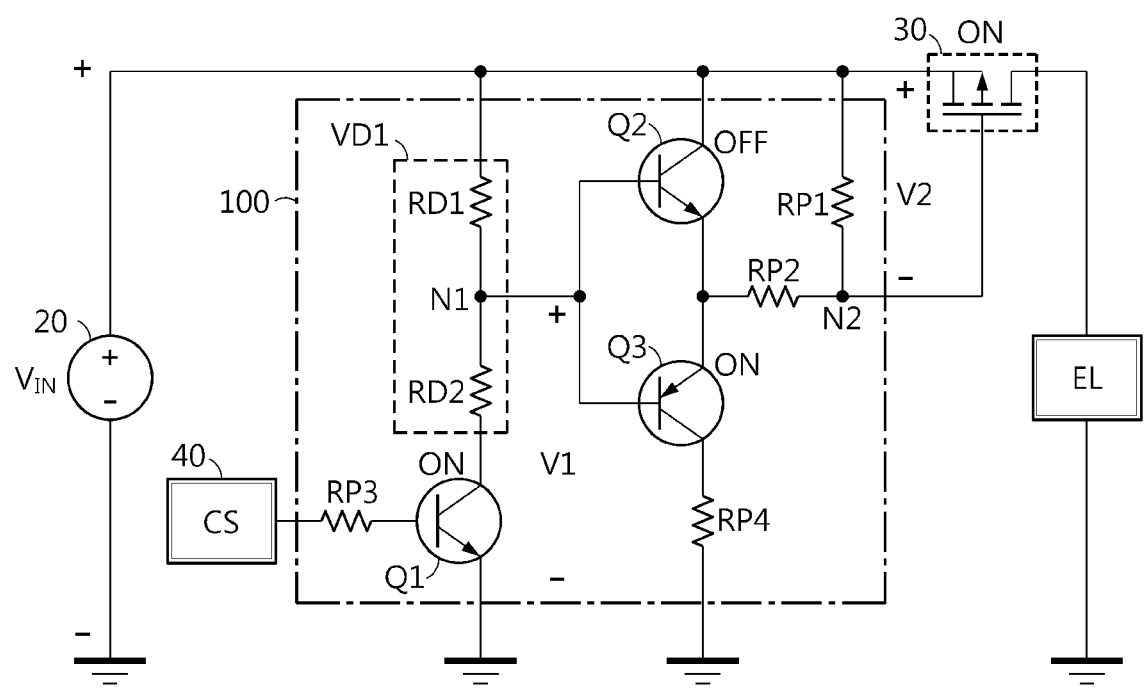
FIG. 3 is a diagram for reference in describing an operation for controlling a main switch shown in FIG. 2 into an ON-state.

FIG. 3 is a diagram for reference in describing an operation for controlling the main switch 30 shown in FIG. 2 into an ON-state.

Referring to FIG. 3, to transition the main switch 30 from the OFF state to the ON-state, the controller 40 outputs the control signal CS to the driver circuit 100. The control signal CS is a voltage having a preset high level, and is transmitted to the first sub-transistor Q1 through the third resistor RP3. That is, the third resistor RP3 acts as a transmission path of the control signal CS.

The first sub-transistor Q1 is turned on in response to the control signal CS being applied to the base terminal of the first sub-transistor Q1. While the first sub-transistor Q1 is kept in an ON-state, the current by the input voltage $V_{IN}$ of the power supply 20 flows through the first voltage divider VD1 and the first sub-transistor Q1. Accordingly, the first voltage divider VD1 generates a first switching voltage V1 (e.g., 1V) that is lower than the input voltage $V_{IN}$ at the first connection node N1 using the input voltage $V_{IN}$ from the power supply 20. The first switching voltage V1 is the sum of a voltage across the second dividing resistor RD2 and a voltage across the first sub-transistor Q1 (i.e., a voltage between the first connection node N1 and the ground). When the first sub-transistor Q1 is turned on, the first switching voltage V1 is applied to the base terminal of each of the second sub-transistor Q2 and the third sub-transistor Q3 through the first connection node N1.

Before the first sub-transistor Q1 is turned on, each of the second sub-transistor Q2 and the third sub-transistor Q3 is in an OFF-state, and thus the voltage of the emitter terminal of each of the second sub-transistor Q2 and the third sub-transistor Q3 is equal to the voltage (i.e., VTN) of the source terminal of the main switch 30.

Accordingly, at the time point in which the first sub-transistor Q1 transitions from the OFF-state to the ON-state, a reverse bias is applied between the base terminal and the emitter terminal of the second sub-transistor Q2, therefore the second sub-transistor Q2 is kept in the OFF-state. On the contrary, at the time point in which the first sub-transistor Q1 transitions from the OFF-state to the ON-state, a forward bias is applied between the emitter terminal and the base terminal of the third sub-transistor Q3, and the third sub-transistor Q3 transitions from the OFF-state to the ON-state.

While the third sub-transistor Q3 is kept in ON-state, the current from the input voltage $V_{IN}$ of the power supply 20 flows through the first resistor RP1, the second resistor RP2, the third sub-transistor Q3 and the fourth resistor RP4. Accordingly, a second switching voltage V2 (e.g., about 11V) applied across the first resistor RP1 is generated.

As shown, the first resistor RP1 is connected between the source terminal and the gate terminal of the main switch 30. Accordingly, while the third sub-transistor Q3 is kept in the ON-state, the voltage of the source terminal of the main switch 30 is kept higher than the voltage of the gate terminal of the main switch 30 by the second switching voltage V2. That is, the source-gate voltage of the main switch 30 is equal to the second switching voltage V2. The main switch 30 transitions to the ON-state when the voltage of the gate terminal is lower than the voltage of the source terminal by the threshold voltage or above. While the main switch 30 is kept in ON-state, power by the input voltage $V_{IN}$ from the power supply 20 is supplied to the electrical load EL through the main switch 30.

Figure 4:
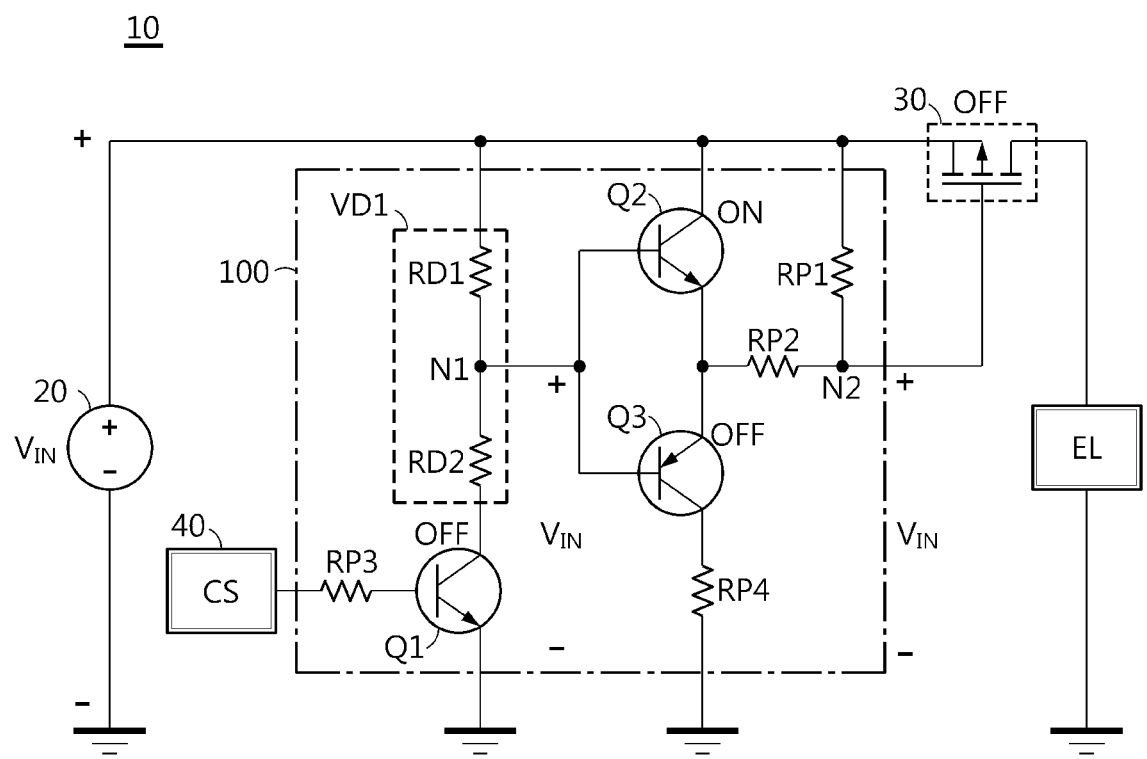
FIG. 4 is a diagram for reference in describing an operation for controlling a main switch shown in FIG. 2 into an OFF-state.

FIG. 4 is a diagram for reference in describing an operation for controlling the main switch 30 shown in FIG. 2 into the OFF-state.

Referring to FIG. 4, the controller 40 stops outputting the control signal CS to transition the main switch 30 to the OFF-state. To stop outputting the control signal CS may be represented by reducing the control signal CS from the high level of voltage to a preset low level of voltage.

The first sub-transistor Q1 is turned off in response to the control signal CS being not applied to the base terminal of the first sub-transistor Q1. While the first sub-transistor Q1 is kept in the OFF-state, the current by the input voltage $V_{IN}$ of the power supply 20 cannot flow through the first voltage divider VD1, and thus the voltage of the first connection node N1 is equal to the input voltage VW. Accordingly, the input voltage $V_{IN}$ is applied to the base terminal of each of the second sub-transistor Q2 and the third sub-transistor Q3 through the first connection node N1.

At the time point immediately before the first sub-transistor Q1 is turned off from the ON-state, a voltage (e.g., V1) lower than the input voltage $V_{IN}$ is applied to the emitter terminal of each of the second sub-transistor Q2 and the third sub-transistor Q3. Accordingly, at the time point in which the first sub-transistor Q1 is turned off from the ON-state, a forward bias is applied between the base terminal and the emitter terminal of the second sub-transistor Q2, therefore the second sub-transistor Q2 transitions from the OFF-state to the ON-state. On the contrary, a reverse bias is applied between the emitter terminal and the base terminal of the third sub-transistor Q3, and the third sub-transistor Q3 transitions from the ON state to the OFF-state.

While the second sub-transistor Q2 is kept in the ON-state, the voltage of the source terminal of the main switch 30 is equal to the voltage of the gate terminal or their difference is so small that they can be treated as being equal, and thus the main switch 30 is turned off. That is, while the second sub-transistor Q2 is kept in the ON-state, the voltage of the source terminal of the main switch 30 is not lower than the voltage of the source terminal by the threshold voltage.

In the embodiments described above with reference to FIGS. 2 to 4, it should be noted that the operation for controlling the main switch 30 into the OFF-state from the ON-state or into the ON-state from the OFF-state is not affected by the drain voltage of the main switch 30. In this regard, according to the related art, the drain voltage of the main switch 30 may change due to a resonance phenomenon caused by the inductance component of the electrical load EL. However, according to the present disclosure, the ON-OFF control of the main switch 30 only relies on the source-gate voltage of the main switch 30, thereby reducing the problem that the main switch 30 unintentionally is turned on or off due to the inductance component of the electrical load EL.

Figure 5:
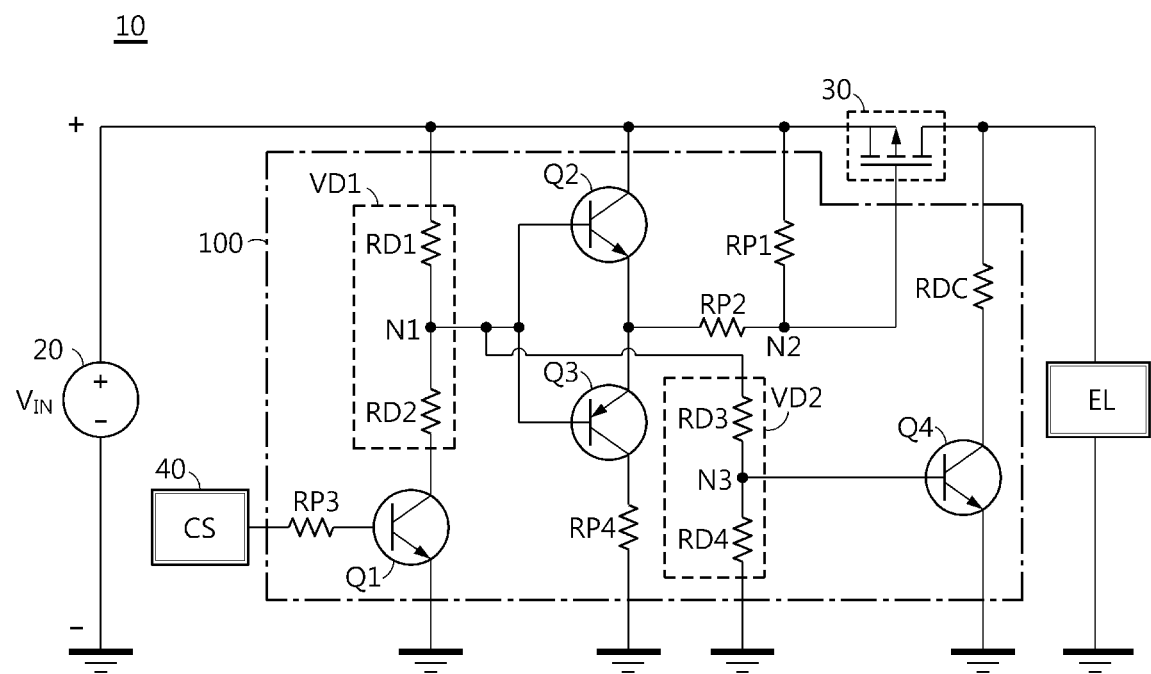
FIG. 5 is an exemplary diagram showing a configuration of a control device according to a second embodiment of the present disclosure.

FIG. 5 is an exemplary diagram showing a configuration of a control device 10 according to a second embodiment of the present disclosure.

Description in common between the control device 10 according to the second embodiment as shown in FIG. 5 and the first embodiment described above with reference to FIGS. 2 to 4 is omitted herein to avoid redundancy, and their difference(s) will be described below.

A difference between the control device 10 of the second embodiment and the control device 10 of the first embodiment is that the driver circuit 100 further includes a second voltage divider VD2, a fourth sub-transistor Q4 and a discharge resistor RDC.

Referring to FIG. 5, the second voltage divider VD2 includes a third dividing resistor RD3 and a fourth dividing resistor RD4. The third dividing resistor RD3 and the fourth dividing resistor RD4 are connected in series through a third connection node N3. The resistance (e.g., 1010 of the third dividing resistor RD3 may be higher than the resistance (e.g., 1 kΩ) of the fourth dividing resistor RD4.

One end of the second voltage divider VD2 (i.e., one end of the third dividing resistor RD3) may be connected to the first connection node N1. Alternatively, one end of the second voltage divider VD2 may be electrically connected to the emitter terminal of the second sub-transistor Q2 or the second connection node N2, instead of the first connection node N1. The other end of the second voltage divider VD2 (i.e., one terminal of the fourth dividing resistor RD4) may be grounded.

The second voltage divider VD2 generates a third switching voltage at the third connection node N3 using the voltage of the first connection node N1, the voltage of the emitter terminal of the second sub-transistor Q2 or the voltage of the second connection node N2. The third switching voltage may refer to a voltage across the fourth dividing resistor RD4. The third switching voltage is applied to the base terminal of the fourth sub-transistor Q4 through the third connection node N3.

The fourth sub-transistor Q4 and the discharge resistor RDC are connected in series between the drain terminal of the main switch 30 and the ground. For example, as shown in FIG. 5, one end of the discharge resistor RDC may be electrically connected to the drain terminal of the main switch 30, the other end of the discharge resistor RDC may be electrically connected to one terminal (e.g., collector) of the fourth sub-transistor Q4, and the other terminal (e.g., emitter) of the fourth sub-transistor Q4 may be grounded.

The fourth sub-transistor Q4 may be an NPN type transistor having a collector terminal, an emitter terminal and a base terminal. The base terminal of the fourth sub-transistor Q4 may be electrically connected to the third connection node N3 to receive an input of the third switching voltage.

The voltage of the third connection node N3 when the first sub-transistor Q1 is in OFF-state is higher than that when the first sub-transistor Q1 is in ON-state. In detail, the third switching voltage when the first sub-transistor Q1 is in ON-state may be lower than the turn-on voltage of the fourth sub-transistor Q4. On the contrary, the third switching voltage when the first sub-transistor Q1 is in OFF-state may be higher than the turn-on voltage of the fourth sub-transistor Q4. Accordingly, while the first sub-transistor Q1 is in OFF-state, the fourth sub-transistor Q4 is turned on in response to the third switching voltage applied to the base terminal of the fourth sub-transistor Q4 through the third connection node N3. On the contrary, while the first sub-transistor Q1 is in ON-state, the fourth sub-transistor Q4 is turned off since the third switching voltage is not enough high.

While the fourth sub-transistor Q4 is in ON-state, a closed circuit including the electrical load EL, the discharge resistor RDC and the fourth sub-transistor Q4 is formed. When the closed circuit is formed, electrical energy remaining in the electrical load EL due to the inductance component of the electrical load EL is consumed by the discharge resistor RDC. Accordingly, it is possible to reduce the likelihood of malfunction of the main switch 30 caused by the inductance component of the electrical load EL more effectively.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A driver circuit for controlling a P-channel Metal Oxide Semiconductor Field Effect transistor (MOSFET) including a gate terminal, a source terminal connected to a power supply, and a drain terminal connected to an electrical load, the driver circuit comprising:
    a first voltage divider including a first dividing resistor and a second dividing resistor connected in series through a first connection node, one end of the first voltage divider being connected to the source terminal of the P-channel MOSFET;
    a first sub-transistor including a first collector terminal, a first emitter terminal and a first base terminal, the first collector terminal being connected to an other end of the first voltage divider, and the first emitter terminal being connected to a ground;
    a second sub-transistor including a second collector terminal, a second emitter terminal and a second base terminal, the second emitter terminal being connected to the gate terminal of the P-channel MOSFET, and the second base terminal being connected to the first connection node;
    a third sub-transistor including a third collector terminal, a third emitter terminal and a third base terminal, the third emitter terminal being connected to the second emitter terminal, and the third collector terminal being connected to the ground; and
    a first resistor connected between the second collector terminal and the second emitter terminal.

2. The driver circuit according to claim 1, wherein the first connection node is further connected to the third base terminal.

3. The driver circuit according to claim 2, wherein a resistance of the first dividing resistor is higher than a resistance of the second dividing resistor.

4. The driver circuit according to claim 1, wherein the third emitter terminal is further connected to the gate terminal of the P-channel MOSFET.

5. The driver circuit according to claim 1, wherein the first voltage divider is configured to generate a first switching voltage at the first connection node using an input voltage from the power supply while the first sub-transistor is turned on, and
    the third sub-transistor is turned on in response to the first switching voltage being applied to the third base terminal.

6. The driver circuit according to claim 5, wherein a second switching voltage across the first resistor is applied between the source terminal and the gate terminal of the P-channel MOSFET while the third sub-transistor is turned on.

7. The driver circuit according to claim 1, wherein an input voltage from the power supply is applied to each of the second base terminal and the third base terminal through the first connection node while the first sub-transistor is turned off,
    the second sub-transistor is turned on in response to the input voltage being applied to the second base terminal,
    the third sub-transistor is turned off in response to the input voltage being applied to the third base terminal, and
    the input voltage is applied to the gate terminal of the P-channel MOSFET through the second emitter terminal while the second sub-transistor is turned on and the third sub-transistor is turned off.

8. The driver circuit according to claim 1, wherein each of the first sub-transistor and the second sub-transistor is an NPN type transistor, and
    the third sub-transistor is a PNP type transistor.

9. The driver circuit according to claim 1, further comprising:
    a second voltage divider connected between the second emitter terminal and the ground, the second voltage divider including a third dividing resistor and a fourth dividing resistor connected in series through a third connection node;
    a fourth sub-transistor including a fourth collector terminal, a fourth emitter terminal and a fourth base terminal, the fourth emitter terminal being connected to the ground, and the fourth base terminal being connected to the third connection node; and
    a discharge resistor, one end of the discharge resistor being connected to the drain terminal of the P-channel MOSFET, and an other end of the discharge resistor being connected to the fourth collector terminal,
    wherein the second voltage divider is configured to generate a third switching voltage at the third connection node while the first sub-transistor is turned off, and
    the fourth sub-transistor is turned on in response to the third switching voltage being applied to the fourth base terminal.

10. A control device comprising the driver circuit according to claim 1.

11. The control device of claim 10, further comprising:
    the P-channel MOSFET;
    the power supply;
    the electrical load; and
    a controller configured to output a control signal to the driver circuit.

12. The control device of claim 11, wherein the P-channel MOSFET is a main switch connected between the power supply and the electrical load to prevent a malfunction of the main switch caused by an inductance component of the electrical load.

13. A driver circuit for controlling a P-channel Metal Oxide Semiconductor Field Effect transistor (MOSFET) including a gate terminal, a source terminal connected to a power supply, and a drain terminal connected to an electrical load, the driver circuit comprising:
    a first voltage divider including at least a first dividing resistor, one end of the first voltage divider being connected to the source terminal of the P-channel MOSFET;
    a first sub-transistor including a first collector terminal, a first emitter terminal and a first base terminal, the first collector terminal being connected to an other end of the first voltage divider, the first base terminal configured to be connected to a controller, and the first emitter terminal being connected to a ground,
    wherein the first sub-transistor is configured to be turned on by a control signal from the controller;
    a second sub-transistor including a second collector terminal, a second emitter terminal and a second base terminal, the second emitter terminal being connected to the gate terminal of the P-channel MOSFET, and the second base terminal being connected to a first connection node;
    a third sub-transistor including a third collector terminal, a third emitter terminal and a third base terminal, the third emitter terminal being connected to the second emitter terminal, and the third collector terminal being connected to the ground; and a first resistor connected between the second collector terminal and the second emitter terminal.

14. The driver circuit of claim 13, wherein each of the first sub-transistor and the second sub-transistor is an NPN type transistor, and the third sub-transistor is a PNP type transistor.

15. The driver circuit of claim 14, wherein the driver circuit is configured to transition the P-channel MOSFET from an OFF-state to an ON-state in response to the controller outputting the control signal.

16. The driver circuit of claim 14, wherein in response to the controller outputting the control signal, a forward bias is applied to the first sub-transistor to transition the first sub-transistor to an ON-state, a reverse bias is applied to the second sub-transistor to transition the second sub-transistor to an OFF state, a forward bias is applied to the third transistor to transition the third transistor to an ON state, and the P-channel MOSFET is transitioned to an ON-state.

17. The driver circuit of claim 16, wherein in response to the controller stopping outputting the control signal, a reverse bias is applied to the first sub-transistor to transition the first sub-transistor to an OFF-state, a forward bias is applied to the second sub-transistor to transition the second sub-transistor to an ON state, a reverse bias is applied to the third transistor to transition the third transistor to an OFF state, and the P-channel MOSFET is transitioned to an OFF-state.

18. The driver circuit according to claim 13, wherein the third emitter terminal is further connected to the gate terminal of the P-channel MOSFET.

19. The driver circuit according to claim 13, wherein the first voltage divider is configured to generate a first switching voltage at the first connection node using an input voltage from the power supply while the first sub-transistor is turned on, and the third sub-transistor is turned on in response to the first switching voltage being applied to the third base terminal.

20. The driver circuit according to claim 19, wherein a second switching voltage across the first resistor is applied between the source terminal and the gate terminal of the P-channel MOSFET while the third sub-transistor is turned on.

* * * * *